United States Patent
Ry et al.

(10) Patent No.: US 7,702,988 B2
(45) Date of Patent: Apr. 20, 2010

(54) SYSTEMS AND METHODS FOR MESSAGE ENCODING AND DECODING

(75) Inventors: Hans Westgaard Ry, Ridabu (NO); Steffen Persvold, Shrewsbury, MA (US); Hakon Bugge, Oslo (NO)

(73) Assignee: Platform Computing Corporation, Markham, Ontario (CA)

( * ) Notice: Subject to any disclaimer, the term of this patent is extended or adjusted under 35 U.S.C. 154(b) by 1075 days.

(21) Appl. No.: 11/256,752

(22) Filed: Oct. 24, 2005

(65) Prior Publication Data

US 2007/0094564 A1    Apr. 26, 2007

(51) Int. Cl.
H03M 13/00    (2006.01)
(52) U.S. Cl. ..................................... 714/774
(58) Field of Classification Search ............... 714/745, 714/755, 758, 799–801
See application file for complete search history.

(56) References Cited

U.S. PATENT DOCUMENTS

| | | | |
|---|---|---|---|
| 4,077,028 A | 2/1978 | Lui et al. | |
| 4,377,862 A | 3/1983 | Koford et al. | |
| 4,712,214 A | 12/1987 | Meltzer et al. | |
| 4,949,333 A | 8/1990 | Gulick et al. | |
| 5,022,051 A | 6/1991 | Crandal et al. | |
| 5,111,457 A | 5/1992 | Rabjohns et al. | |
| 5,438,621 A | 8/1995 | Hornal et al. | |
| 5,502,728 A | 3/1996 | Smith, III | |
| 5,515,380 A | 5/1996 | Giger | |
| 5,694,407 A | 12/1997 | Glaise | |
| 5,706,298 A * | 1/1998 | Sandorfi | 714/807 |
| 5,889,794 A * | 3/1999 | Mo et al. | 714/784 |
| 6,202,097 B1 * | 3/2001 | Foster et al. | 709/238 |
| 6,412,092 B1 | 6/2002 | Raghunath | |
| 6,453,440 B1 | 9/2002 | Cypher | |
| 6,489,900 B2 | 12/2002 | Shin et al. | |
| 6,912,686 B1 | 6/2005 | Rodriguez et al. | |
| 7,123,578 B2 | 10/2006 | Walker | |
| 7,266,747 B2 | 9/2007 | Foss | |
| 2003/0070042 A1 | 4/2003 | Byrd et al. | |
| 2004/0098655 A1 | 5/2004 | Sharma | |
| 2005/0097361 A1 | 5/2005 | Apostolopoulos et al. | |

(Continued)

FOREIGN PATENT DOCUMENTS

EP    1 130 512 A    9/2001

(Continued)

OTHER PUBLICATIONS

Duan et al., "Analysis and Avoidance of Cross-talk in On-Chip Buses," *Proc. of Symposium on High Performance Interconnects*, 133-138 (2001).

(Continued)

*Primary Examiner*—Shelly A Chase
(74) *Attorney, Agent, or Firm*—Baker & McKenzie LLP

(57) ABSTRACT

Presented herein are systems and methods for checking the integrity of data transmissions between or within one or more digital processing systems by identifying a data characteristic that is likely to change if there is an error in transmission. According to one embodiment, data messages are modified to achieve a selected characteristic according to a predetermined protocol, and changes to the data are recorded in a longitudinal check code (LCC) word, which is used by the receiver to decode the data message and restore the original data.

16 Claims, 5 Drawing Sheets

U.S. PATENT DOCUMENTS

2005/0138046 A1    6/2005    Miettinen et al.

FOREIGN PATENT DOCUMENTS

GB          2355138      *    4/2001
JP        62 213333 A         9/1987
WO     WO-2005/043389 A       5/2005

OTHER PUBLICATIONS

Stan et al., "Bus-Invert Coding for Low-Power I/O," *IEEE Transactions on Very Large Scale Integration (VLSI) Systems*, 3:49-58 (1995).

* cited by examiner

SYSTEMS AND METHODS FOR MESSAGE ENCODING AND DECODING

BACKGROUND

Data transmission in communication systems involves sending information over a pathway. Digital data is represented as a stream of bits or bytes, which may be sent from one location to another. As the data is sent from one location to another, the receiver might observe partially received message fragments and/or parts of the message delivered out-of-order with respect to each other. Current methods used to check data integrity include several steps. First the sender initiates message transmission. Next, the sender must ensure that the message meets standards of global consistency. Then, the sender must notify the receiver that a message has been sent by, for example, sending an interrupt or increasing a counter. These methods are resource-intensive, requiring high amounts of processor power and slowing data transmission, and are therefore expensive to implement.

SUMMARY OF THE INVENTION

Other objects of the invention will, in part, be obvious, and, in part, be shown from the following description of the systems and methods shown herein. The invention, in various embodiments, increases the speed of data transmissions and reduces the amount of processor power necessary for checking data integrity. According to one aspect, this is achieved through the use of an efficient data encoding technique. Data messages are modified according to a predetermined protocol, and changes to the data are recorded in a longitudinal check code (LCC) word. The LCC word is used by the receiver to verify complete reception of the data message, to decode the data message and restore the original data. This method does not require the sender to ensure that the message meets standards of global consistency or to notify the receiver. Thus, it reduces the number of steps necessary to check data integrity, increasing transmission speed and reducing the amount of processor power necessary for checking the data. According to further embodiments, the invention enables a communication protocol in which the receiver begins processing a message, before it has been completely received.

The invention, among other things, provides systems and methods for checking the integrity of data transmission. In one aspect, methods include breaking a data message into a plurality of words having an integer n number of bits; grouping the n-bit words into word groups having (n−m) n-bit words, where $0 < m < n$; conditionally modifying the n-bit words to have a selected characteristic; generating a longitudinal check code (LCC) word for a respective word group, which records the characteristics of the n-bit words of the word group; and adding the LCC word to the respective word group, resulting in word groups that have (n−m+1) words, wherein the n-bit words of the new word groups may be analyzed to check the integrity of the data transmission, and the LCC word may be used to restore the data message.

According to one feature, the n-bit words of a word group are conditionally modified to have a selected characteristic. In one embodiment, the n-bit words may be modified by altering a bit from the n-bit words to achieve a selected value of the bit. For example, a selected bit of each n-bit word may be modified, such that the selected bit in all the n-bit words in the word group equals zero. In another embodiment, an n-bit word may be modified by altering a bit from the n-bit word to achieve a selected parity characteristic for the n-bit word. For example, a selected bit from the n-bit words of a word group may be conditionally altered such that the n-bit words of the word group have an even parity. According to a further embodiment an n-bit word is interpreted as having a sign, and an n-bit word may be modified by altering the sign of the n-bit word to achieve a selected sign of the n-bit word. For example, the n-bit words of a word group may be conditionally altered such that the sign of the n-bit words in the word group is positive.

According to another feature, the LCC word records selected characteristics of the n-bit words of the word group. In one embodiment, the LCC word may be generated by recording the presence of a change in each n-bit word of a word group in a corresponding bit of the LCC word. For example, if an n-bit word of a word group is modified then a corresponding bit of the LCC word may be set to equal 1, and if the n-bit word is not modified the corresponding bit of the LCC word may be set to equal 0. In another embodiment, the LCC word may be generated by recording the presence of a change in the sign of each n-bit word in a corresponding bit of the LCC word. According to an alternative embodiment, the LCC word may be generated by recording the original value of a bit from an n-bit word in a corresponding bit of the LCC word. For example, if the selected bit from an n-bit word equals 1, and the selected bit is altered to achieve a selected characteristic, the original value of the bit, 1, will be recorded in a corresponding bit of the LCC. Similarly, if the selected bit will not be altered to achieve the selected characteristic, the original value of the bit, 1, will still be recorded in the corresponding bit of the LCC word. In one configuration, the LCC word may be generated by recording the original sign of an n-bit word of a word group in a corresponding bit of the LCC word.

In one embodiment, an unused bit of the LCC word may be modified to achieve a selected characteristic of the LCC word. The selected characteristic may include, for example, a selected value of the unused bit, a selected parity characteristic of the LCC word, a selected sign of the LCC word, or any other suitable characteristic that may be identified by a communication system.

According to one embodiment, the n-bit words of a word group may be conditionally modified to achieve a selected characteristic of the n-bit words as defined by a predetermined protocol. This may include, for example, altering a bit from each n-bit word to achieve a selected characteristic for each n-bit word, such that the selected characteristic of each successive n-bit word in a word group follows the predetermined protocol. The selected characteristic may include, for example, a selected value of a selected bit in each word, a selected parity characteristic of each word, a selected sign of each word, or any other suitable characteristic. The predetermined protocol may call for all n-bit words of a word group to have a selected characteristic that is common across all the n-bit words of the word group. Alternatively, the predetermined protocol may call for the n-bit words of a word group to have a selected characteristic that alters between each successive n-bit word of the word group. The protocol selected may vary and any suitable protocol may be employed, with the protocol being selected, typically, based on the application being addressed.

According to another embodiment, the LCC word may be conditionally modified to achieve a selected characteristic as defined by a predetermined protocol. The selected characteristic may include any of the characteristics described above or any other suitable characteristic. The predetermined protocol may, for example, call for the selected characteristic of the LCC word to be similar to the selected characteristic of the n-bit words in the word group it represents. Alternatively, the predetermined protocol may, for example, call for the selected characteristic of the LCC word to be different from the selected characteristic of the n-bit words in the word group it represents. For example, if the n-bit words of a word group are conditionally modified to achieve an even parity characteristic of the n-bit words, the LCC word may be conditionally modified to achieve an odd parity characteristic.

In various embodiments, the word group is transmitted to a receiving data buffer, comprising word locations. The word locations of the receiving data buffer contain original values. According to one feature, the n-bit words of a word group are conditionally modified to achieve a selected characteristic as defined by a predetermined protocol. The predetermined protocol is used to ensure that the characteristics of the n-bit words in the word group are different from the original values in the respective word positions of the receiving data buffer. Additionally, the LCC word may be conditionally modified to achieve a selected characteristic as defined by the predetermined protocol, and the predetermined protocol may be used to ensure the characteristics of the LCC word are different from the original values in the respective word positions of the receiving data buffer.

BRIEF DESCRIPTION OF THE DRAWINGS

The foregoing and other objects and advantages of the invention will be appreciated more fully from the following further description thereof, with reference to the accompanying drawings wherein.

DESCRIPTION OF THE ILLUSTRATED EMBODIMENTS

To provide an overall understanding of the invention, certain illustrative embodiments will now be described, including a system for checking the integrity of a data transmission between or within one or more digital processing systems by identifying a characteristic of the data that is likely to change if a message has been partially received or if the data in a message has been reordered in transmission, and conditionally modifying the data to achieve the selected characteristic. However, it will be understood by one of ordinary skill in the art that the systems and methods described herein can be adapted and modified for other suitable applications and that such other additions and modifications will not depart from the scope hereof.

More particularly, presented herein are systems and methods for checking the integrity of data transmissions between or within one or more digital processing systems by identifying a data characteristic that is likely to change if a message has been partially received or if the data in a message has been reordered. In one aspect, the invention provides data transmission systems that process a data message that is to be sent to a receiving device. The data transmission system processes the message by looking at the data words being sent. It identifies a characteristic that is likely to change if there is an error in data transmission. The data transmission system creates a longitudinal code check (LCC) word to record the data characteristics associated with the words in the message. After transmission the receiver can check whether the data transmission was successful by checking for the expected characteristics of the data.

In another aspect, the invention provides processes for checking the integrity of data transmissions between two or more computers. The processes provide methods for encoding data such that it conforms to selected characteristics. Additionally, methods are provided for creating an LCC word, which records the data characteristics. Alternatively, the LCC word may record changes that are made to the data when it is encoded to meet the selected characteristics. After data transmission, the processes provide methods for checking the integrity of the received data by checking for the expected characteristics of the data. Additionally, if changes were made to the data, the LCC word may be employed to restore the original data message.

Figure 1:
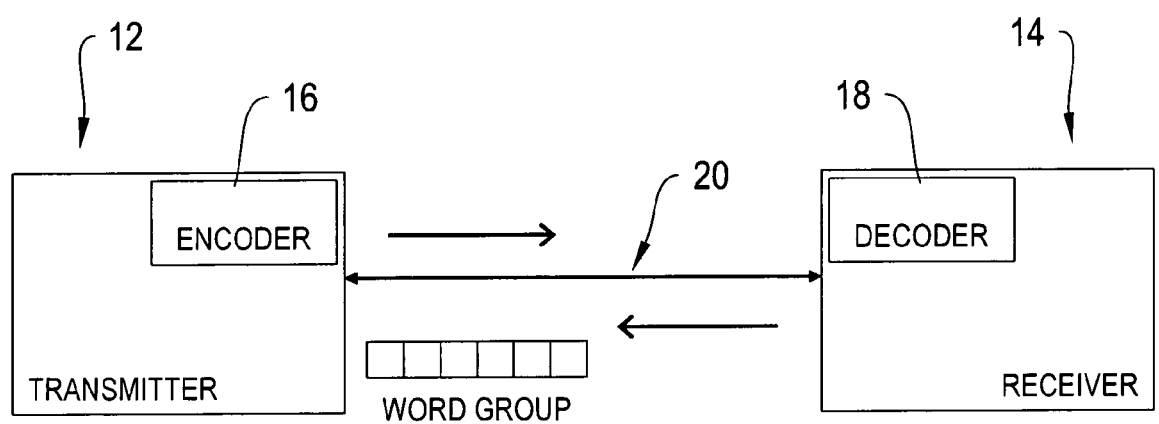
FIG. 1 shows a block diagram of a system for checking the integrity of data transmissions.

More particularly, FIG. 1 depicts a functional block diagram of a system 10 for checking integrity of data transmissions. FIG. 1 shows a transmitter 12 and a receiver 14. The transmitter 12 includes an encoder 16 that encodes data messages for transmission over a communications channel 20. The data messages are received by receiver 14 which includes a decoder 18. The decoder 18 decodes the data messages.

In one embodiment, the transmitter 12 may be a data processing system, such as a conventional data processing platform such as an IBM PC-compatible computer running the Windows operating systems, or a Sun workstation running a Unix operating system. Alternatively, the transmitter 12 may comprise a dedicated processing system that includes an embedded programmable data processing system that can include the encoder 16. For example, the transmitter 12 may be a data processing system that can comprise a single board computer system that has been integrated into a system for performing data encoding and transmission. In an alternative embodiment, the transmitter 12 may also comprise a single board computer (SBC) system that can be any suitable SBC, including the SBCs sold by the Micro/Sys Company, which include microprocessors, data memory and program memory, as well as expandable bus configurations and an on-board operating system. According to a further embodiment, the transmitter 12 may be a dedicated hardware component, such as a dedicated server.

According to one embodiment, the receiver 14 may also be a data processing system, such as a conventional data processing platform such as an IBM PC-compatible computer running the Windows operating systems, or a Sun workstation running a Unix operating system. Alternatively, the receiver 14 may comprise a dedicated processing system that includes an embedded programmable data processing system that can include the decoder 18. For example, the receiver 14 may be a data processing system that can comprise a single board computer system that has been integrated into a system for performing data reception and decoding. In an alternative embodiment, the receiver 14 may also comprise a single board computer (SBC) system that can be any suitable SBC, including the SBCs sold by the Micro/Sys Company, which include microprocessors, data memory and program memory, as well as expandable bus configurations and an on-board operating system. According to a further embodiment, the receiver 14 may be a dedicated hardware component, such as a dedicated server.

According to another embodiment, the transmitter 12 and/or receiver 14 can be realized as a software component operating on a conventional data processing system such as a Unix workstation. In that embodiment, the transmitter 12 and/or receiver 14 can be implemented as a C language computer program, or a computer program written in any high level language including C++, Fortran, Java or basic. Additionally, in an embodiment where microcontrollers or DSPs are employed, the transmitter 12 and/or receiver 14 can be realized as a computer program written in microcode or written in a high level language and compiled down to microcode that can be executed on the platform employed. The development of such transmission systems is known to those of skill in the art. Additionally, general techniques for high level programming are known, and set forth in, for example, Stephen G. Kochan, Programming in C, Hayden Publishing (1983). It is noted that DSPs are particularly suited for implementing signal processing functions, including preprocessing functions such as image enhancement through adjustments in contrast, edge definition and brightness. Developing code for the DSP and microcontroller systems follows from principles well known in the art.

Accordingly, although FIG. 1 graphically depict the data transmitter 12 and the data receiver 14 as functional block elements, it will be apparent to one of ordinary skill in the art that these elements can be realized as computer programs or portions of computer programs that are capable of running on a data processor platform and to thereby configure a data processor as a system according to the invention.

The encoder 16 is a part of the transmitter 12, and may be implemented in a similar manner to those described above, or it may be coded as software or firmware. The encoder processes the data message, segmenting it into words and word groups, and then adjusts the characteristics of the words in a word group according to a predetermined protocol. The encoder additionally encodes the data characteristics in an LCC word, which it adds to each word group.

The decoder 18 is a part of the receiver 14, and may be implemented in a similar manner to those described above, or it may be coded as software or firmware. The decoder processes the received transmission, segmenting it into words and word groups, and checks the words in a word group for the expected characteristics, as defined by a predetermined protocol. The decoder decides whether to accept a word group based on whether the words correspond to the expected characteristics. If the decoder accepts the word group, it then uses the LCC word to restore the original data to the words of the data message. If the decoder rejects the word group, it may wait until the word group has been completely received or it may contact the transmitter to relay that words have been lost in transmission, and it may request retransmission of the word group.

The communications channel 20 is a pathway over which information can be conveyed. Data may be transmitted using any number of technologies, including physical wires such as wire cables or optical fiber, or it may be wireless, such as radio-link, laser, radio, infra-red light, or other radiated energy source. The information has a source, from which it originates, and a destination, or receiver, to which it is delivered.

Figure 2:
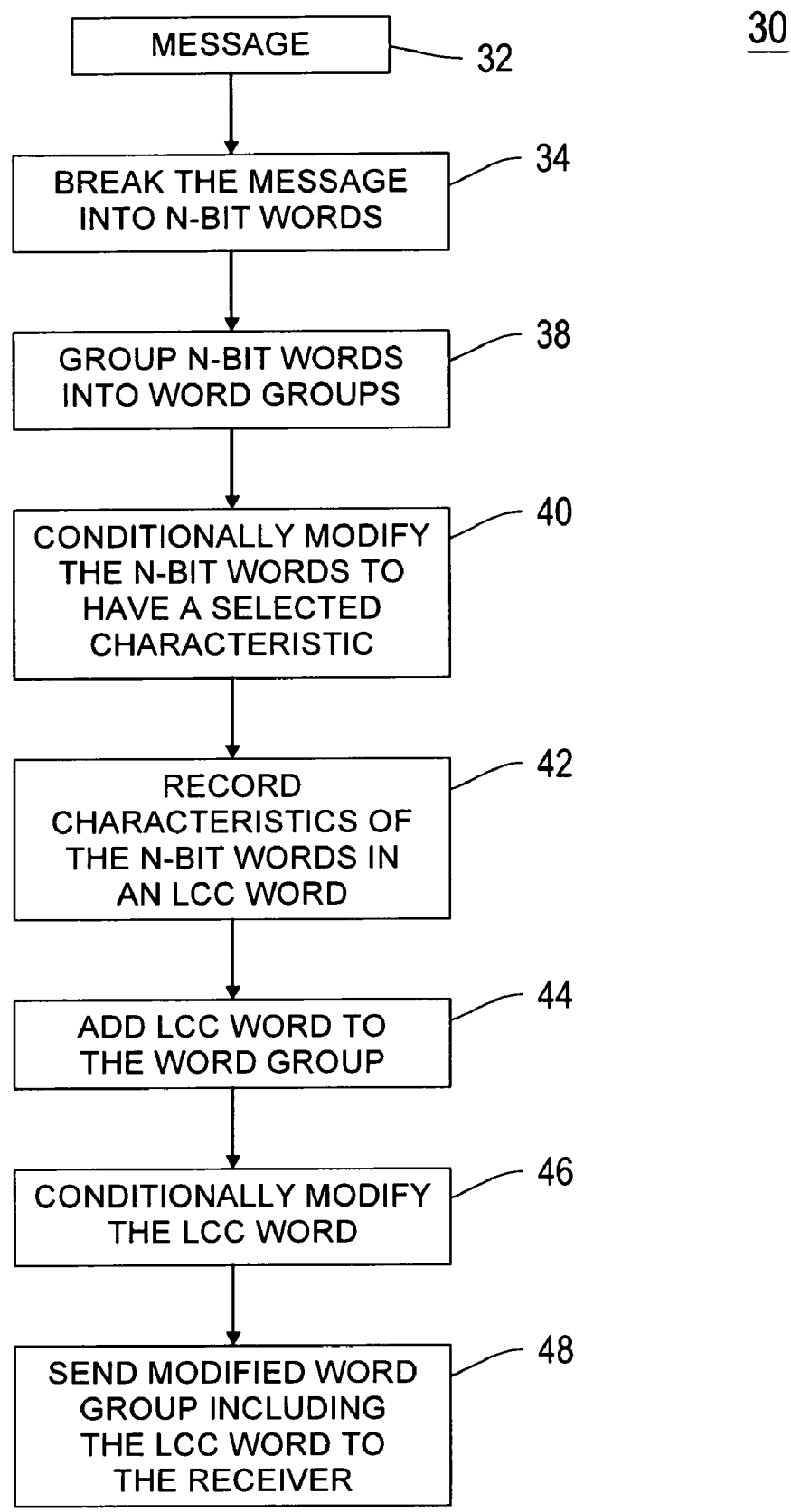
FIG. 2 shows a flow chart diagram of a process by which a data transmitter encodes a data message.

FIG. 2 depicts a flow chart diagram of a process 30 by which a data transmitter 12 encodes a message for transmission to the receiver 14. The process 30 includes a message 32, which may be an email, a media stream, or any other form of electronic communication, and is comprised of a stream of bits. In step 34, the message 32 is segmented into a plurality of n-bit words. The n-bit words are grouped together to form a plurality of word groups, as shown in step 38. The word groups, according to one feature, contain less than n words each. The n-bit words in a selected word group are conditionally modified to have a selected characteristic, resulting in modified n-bit words, as shown in step 40. According to one feature, the selected characteristic may include, by way of example, the parity, the value of a selected bit, the sign of the word, or any other characteristic that may change during the transmission. The data transmitter 12 may use a predetermined protocol to determine the characteristic of each n-bit word in a word group, and the characteristic may be encoded by the encoder 16. According to another feature, in step 42, the characteristics of the n-bit words in a word group are recorded in an LCC word. For example, the LCC word may be generated by recording the presence of a change in each n-bit word of the word group in a corresponding bit of the LCC word. For instance, if an n-bit word of the word group is modified, then a corresponding bit of the LCC word may be set to equal 1, and if the n-bit word of the word group is not modified, then a corresponding bit of the LCC word may be set to equal 0. For example, the parity characteristic of the data words may be conditionally adjusted by altering the value of a bit in each word in a word group. The LCC word contains one bit for each data word in the word group, so for each word that has been conditionally altered, a corresponding bit of the LCC word may be set to record the presence of a change in the data word. In another example, the LCC word may be generated by recording the original value of a bit from an n-bit word in a corresponding bit of the LCC word, before the n-bit words of the word group are conditionally modified. The LCC word may be added to the word group it represents, resulting in a modified word group, as shown in step 44. Additionally, according to one feature, the LCC word itself may be modified to achieve a selected characteristic, as shown in step 46. In step 48, the modified word group, along with the LCC word, is sent to the receiver.

Figure 3:
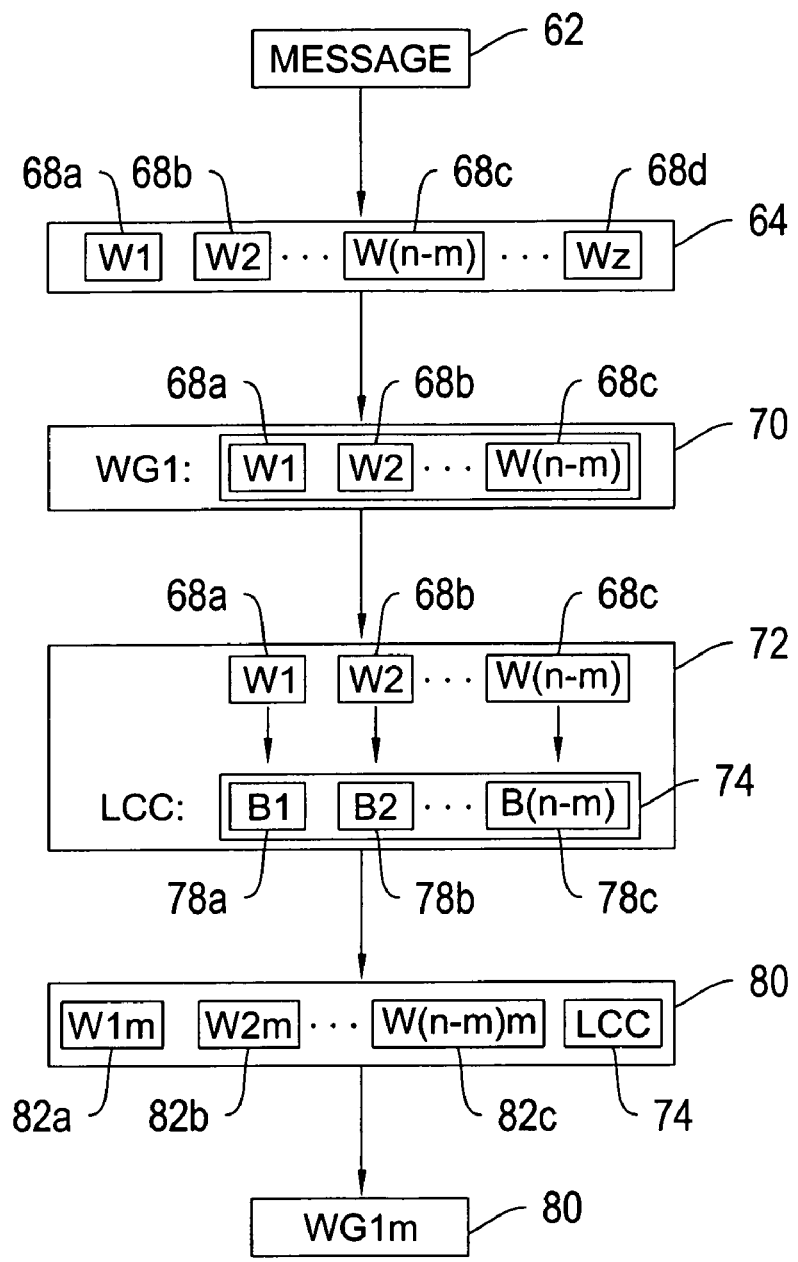
FIG. 3 shows a flow chart diagram of a method of encoding a data message.

FIG. 3 shows, in more detail, a method 60 of encoding a data message 62. The method 60 in step 62 starts processing a message and breaks down the message into z (where z is an integer) n-bit words 68a-68d (where n is an integer), in step 64. The message may be segmented into n-bit words from a block of data that is divided into separate sections, or alternatively as a stream of data that is fed sequentially into a series of n-bit sections. The first (n−m) words 68a-68c (where m is an integer, and 0<m<n) form a first word group 70. The words 68a-68c of word group 70 are then modified to have a selected characteristic in step 72. Optionally, one or several bits from each word 68a-68c may be modified. According to one embodiment, the words 68a-68c may be modified such that all the words 68a-68c in the word group 70 have a selected parity characteristic. For example, one or several bits from each word 68a-68c may be modified such that the words 68a-68c have an even parity. Alternatively, the words 68a-68c may be modified such that the parity characteristic of each successive word 68a-68c follows a predetermined protocol. According to another embodiment, the words 68a-68c may be interpreted as signed integers, and may be modified such that the all words 68a-68c in the word group 70 have a selected sign. For example, one bit from each word 68a-68c may be modified such that the words 68a-68c have a positive sign. In another example, the words 68a-68c may be modified such that the sign of each successive word 68a-68c is modified to follow a predetermined protocol. According to a further embodiment, the words 68a-68c may be modified such that all the words 68a-68c in the word group 70 have a selected value in selected bit position in each word. For example, a selected bit from each word 68a-68c may be modified such that the words 68a-68c have the same value in the selected bit position. In another example, the words 68a-68c may be modified such that the value of a selected bit position is modified to follow a predetermined protocol.

The predetermined protocol that may be followed for adjusting the characteristics of the data contains information on expected data characteristics. The protocol may be any established pattern of characteristics or bits, and is known to both the transmitter and the receiver. For example, the predetermined protocol may call for all words of a word group to have an even parity characteristic. In another example, the predetermined protocol may call for an alternating parity characteristic pattern, in which the parity of each successive word in a word group is opposite from the parity of the previous word. The predetermined protocol may define an expected pattern of any suitable characteristic that may be identified by a communications system.

As shown in FIG. 3, as the words 68a-68c of the word group 70 are modified, an LCC word 74 is created to record changes in the words 68a-68c. In particular, the first bit 78a of the LCC word 74 may record a change in a bit of the first word 68a of the word group 70, the second bit 78b of the LCC word 74 may record a change of a bit and the second word 68b of the word group 70, and the (n-m) bit 78c of the LCC word may record a change in the (n-m) word 68c of the word group 70. For example, if a change occurred to a bit of word 68a, the bit 78a of the LCC word 74 may be set to 1 to record the presence of a change, while if no change occurred to the word 68a, the bit 78a may be set to 0 to record that no change was made. Alternatively, the bits 78a-78c of the LCC word 74, may record the original value of the selected bit from the words 68a-68c that may be modified. For example, if a the selected bit of the word 68a equals 1, a bit 78a of the LCC word 74 may be set to 1 to record this value, regardless of whether or not a change is made to the selected bit of the word 68a. Thus, according to one embodiment, the LCC word 74 is created by repeating one of these processes each word of the word group 70 and a corresponding bit of the LCC word 74. However, the LCC word may also be created by any other acceptable method. After the words 68a-68c have been modified, and the LCC word 74 has been created, the LCC word 74 is attached to the word group it represents. This results in a modified word group 80 which contains the modified words 82a-82c and the LCC word 74 that represents the modifications to the words 82a-82c.

Figure 4:
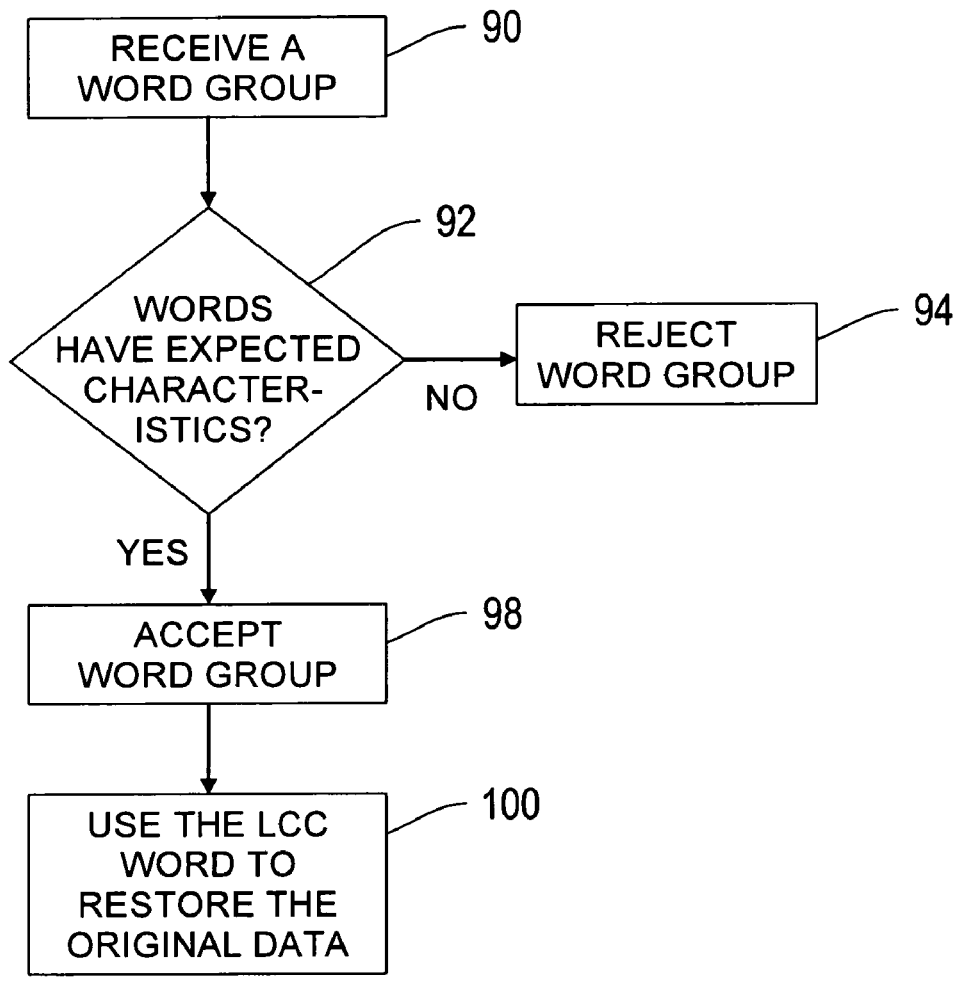
FIG. 4 is a block diagram of a process by which a data receiver decodes a received data message.

FIG. 4 shows a block diagram of a method 88 for decoding data that has been sent to the data receiver. In step 90, the word group of a message is received by a data receiver. After the word group is received, it is checked to ensure that it has the expected characteristics in step 92, as defined by a predetermined protocol. The predetermined protocol is substantially similar to the protocol used by the encoder to encode the data in the word group. According to one feature, if the word group does not contain the expected characteristics, it is rejected in step 94, whereas if the word group does contain the expected characteristics, it is accepted in step 98. Once the word group has been accepted, the LCC word is used to restore the original data to the word group, in step 100.

Figure 5:
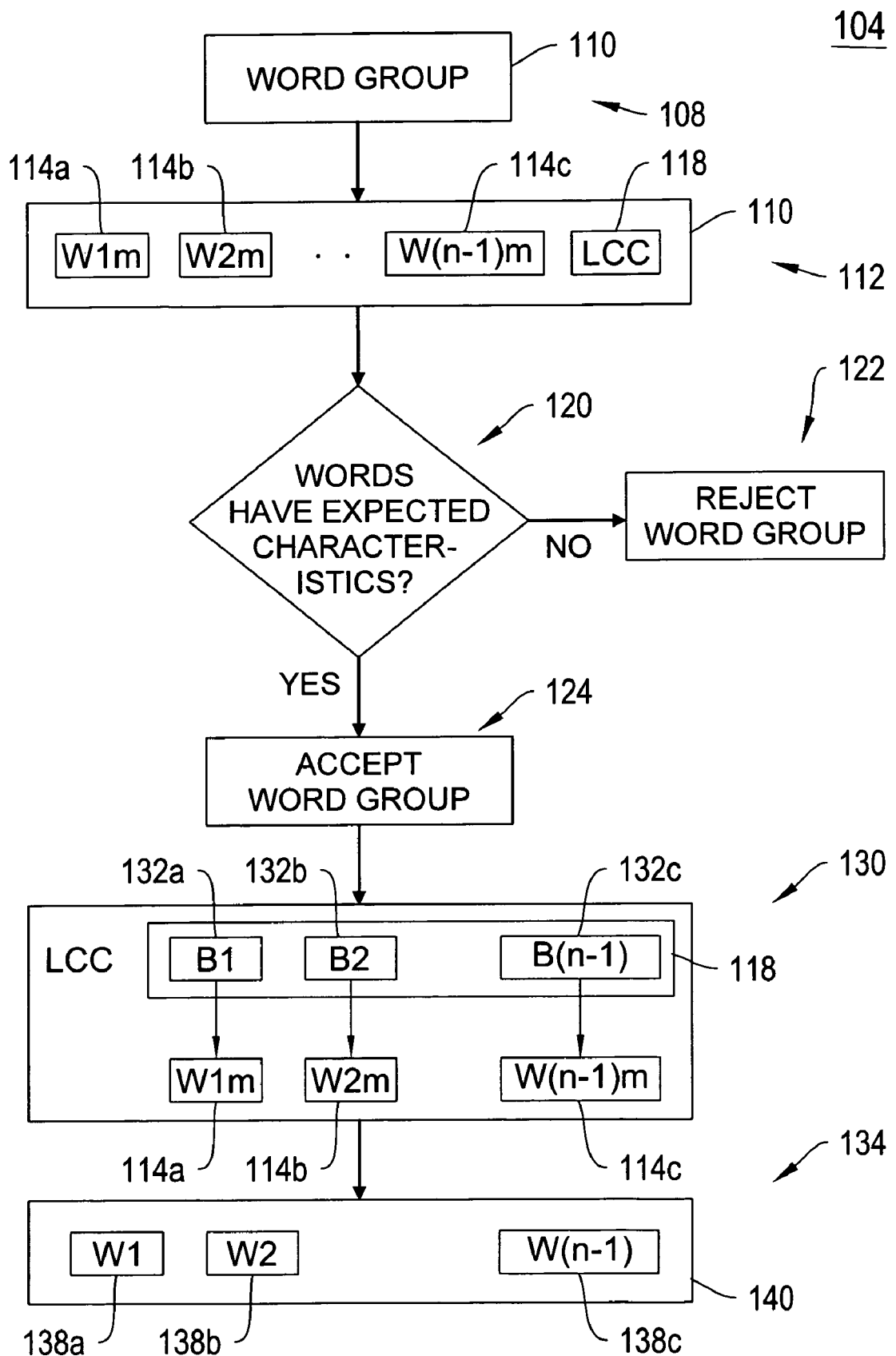
FIG. 5 shows a flow chart diagram a method of decoding a data message.

FIG. 5 shows a more detailed method 104 of decoding a word group of a message. In step 108, a modified word group 110 is received by a data receiver. A decoder segments the modified word group 110 into a plurality of modified words 114a-114c and an LCC word 118, as shown in step 112. Next, in step 120, the decoder determines if the modified words contain the expected characteristics, as defined by a predetermined protocol. According to one feature, if the modified words 114a-114c do not contain the expected characteristics, the modified word group 110 is rejected in step 122, whereas if the modified words 114a-114c contain the expected characteristics, the modified word group 110 is accepted in step 124. If the modified word group is rejected, the receiver may wait until the word group is completely received, send an error message to the transmitter, or it may request retransmission of the modified word group. If the modified word group 110 is accepted, then it may be processed in step 130. The bits 132a-132c of the LCC word 118 are used to restore the original data to the modified words 114a-114c. According one feature, the bits 132a-132c of the LCC word 118 contain information about whether a selected bit of the modified words 114a-114c has been changed. According a further feature, the bits 132a-132c of the LCC word 118 contain information about whether a plurality of selected bits of the modified words 114a-114c have been changed. Depending on the value of the respective bits 132a-132c, the value of the selected bit or bits of the respective modified words 114a-114c may be changed to restore the original data. For example, if the bit 132a of the LLC word 118 indicates that no change was made to the selected bit or bits of the word 114a, then no changes will be made to the word 114a to restore the original data in the word 114a. However, if the bit 132a of the LLC word 118 indicates that a change was made to the selected bit or bits of the word 114a, then the selected bit or bits will be changed to restore the original data in the word 114a. According to another feature, the bits 132a-132c of the LCC word 118 contain the original data from a selected bit position of the modified words 114a-114c, and the bits 132a-132c are used to replace the selected bits of the modified words 114a-114c and restore the original data. According to a further feature, the bits 132a-132c of the LCC word 118 contain data about a selected bit position or a plurality of selected bit positions of the modified words 114a-114c, and the bits 132a-132c are used to restore the original data of the selected bits of the modified words 114a-114c. In step 134, the original data has been restored to the modified word group 110, resulting in word group 140 comprising words 138a-138c.

Those skilled in the art will know or be able to ascertain using no more than routine experimentation, many equivalents to the embodiments and practices described herein. Accordingly, it will be understood that the invention is not to be limited to the embodiments disclosed herein, but is to be understood from the following claims, which are to be interpreted as broadly as allowed under the law.

We claim:

1. A system for checking the integrity of data transmission, comprising:
    a transmitter apparatus for segmenting a data message into a plurality of n-bit words, and grouping the n-bit words into word groups of (n-m) n-bit words (where 0<m<n),
    an encoder for conditionally modifying the n-bit words to have a selected characteristic, generating a longitudinal check code (LCC) word for a respective word group to record characteristics of the n-bit words of the word group, and adding the LCC word to the respective word group resulting in word groups of (n-m+1) words,
    a receiver apparatus for receiving the data message, and
    a decoder for analyzing the n-bit words of the word groups of (n-m+1) words together with the LCC word to check the integrity of the data transmission, and restoring the data message.

2. The system of claim 1, wherein the encoder interprets an n-bit word as having a sign, and modifies an n-bit word by altering at least one bit from the n-bit word to achieve one of:
    a selected value of the at least one bit,
    a selected parity characteristic for the n-bit word, and
    a selected sign of the n-bit word.

3. The system of claim 1, wherein the encoder generates the LCC word by recording the occurrence of a change in each n-bit word of a word group in a corresponding bit of the LCC word.

4. The system of claim 3, wherein the encoder records the occurrence of a change in an n-bit word by recording whether at least one bit from the n-bit word is altered to achieve of:
- a selected value of the at least one bit,
- a selected parity characteristic for the n-bit word, and
- a selected sign of the n-bit word.

5. The system of claim 1, wherein the encoder generates the LCC word by recording the original value of a bit from an n-bit word of a word group in a corresponding bit of the LCC word.

6. The system of claim 1, wherein the encoder generates the LCC word by recording the original parity characteristic for an n-bit word of a word group in a corresponding bit of the LCC word.

7. The system of claim 1, wherein the encoder generates the LCC word by recording the original sign of an n-bit word of a word group in a corresponding bit of the LCC word.

8. The system of claim 1, wherein the encoder modifies an unused bit of the LCC word to result in the LCC word having a selected characteristic.

9. The system of claim 1, wherein the encoder interprets the LCC word as having a sign, and modifies at least one unused bit of the LCC word to achieve one of:
- a selected value of the at least one bit,
- a selected parity characteristic of the LCC word, and
- a selected sign characteristic of the LCC word.

10. The system of claim 1, wherein the encoder conditionally modifies the n-bit words of a word group to achieve a selected characteristic of the n-bit words, as defined by a predetermined protocol.

11. The system of claim 1, wherein the encoder interprets the n-bit words of a word group as having a sign, and conditionally modifies the n-bit words of a word group by altering at least one bit from each n-bit word to achieve one of:
- a selected parity characteristic for each n-bit word, such that the parity characteristic of each successive n-bit word in the word group follows a predetermined protocol,
- a selected value of the bit of the n-bit word, such that the selected value of the bit for each successive n-bit word in the word group follows a predetermined protocol, and
- a selected sign of each n-bit word, such that the selected sign of each successive n-bit word in the word group follows a predetermined protocol.

12. The system of claim 1, wherein the encoder conditionally modifies the LCC word to achieve a selected characteristic of the LCC word, as defined by a predetermined protocol.

13. The system of claim 1, wherein the encoder interprets the LCC word as having a sign, and conditionally modifies the LCC word by altering an unused bit of the LCC word to achieve one of:
- a selected value of the bit, as defined by a predetermined protocol,
- a selected parity characteristic of the LCC word, as defined by a predetermined protocol, and
- a selected sign characteristic of the LCC word, as defined by a predetermined protocol.

14. The system of claim 1, wherein the transmitter apparatus transmits the word group to a receiving data buffer, which comprises word positions containing original values.

15. The system of claim 14, wherein:
the encoder conditionally modifies the n-bit words of a word group to achieve a selected characteristic of the n-bit words, as defined by a predetermined protocol, and
the decoder uses the predetermined protocol to ensure that the characteristics of the n-bit words in the word group are different from original values in the respective word positions of the receiving data buffer.

16. The system of claim 15, wherein:
the encoder conditionally modifies the LCC word to achieve a selected characteristic, as defined by a predetermined protocol, and
the decoder uses the predetermined protocol to ensure that the characteristics of the LCC word are different from original values in the respective word positions of the receiving data buffer.

* * * * *